(12) United States Patent
Yu

(10) Patent No.: US 7,557,633 B2
(45) Date of Patent: Jul. 7, 2009

(54) HIGH SPEED ANALOG ENVELOPE DETECTOR

(75) Inventor: Jae-Suk Yu, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 313 days.

(21) Appl. No.: 11/242,754

(22) Filed: Oct. 4, 2005

(65) Prior Publication Data

US 2006/0132192 A1 Jun. 22, 2006

(30) Foreign Application Priority Data

Dec. 20, 2004 (KR) .................. 10-2004-0108790

(51) Int. Cl.
*H03L 5/00* (2006.01)
(52) U.S. Cl. .................. 327/333; 327/58; 327/62
(58) Field of Classification Search .................. None
See application file for complete search history.

(56) References Cited

U.S. PATENT DOCUMENTS

| | | | | |
|---|---|---|---|---|
| 5,510,731 | A * | 4/1996 | Dingwall | 326/63 |
| 5,559,464 | A * | 9/1996 | Orii et al. | 327/333 |
| 5,621,340 | A | 4/1997 | Lee et al. | 327/65 |
| 6,437,627 | B1 * | 8/2002 | Tran et al. | 327/333 |
| 6,525,571 | B2 | 2/2003 | Green | 326/115 |
| 6,559,686 | B1 | 5/2003 | Ge | 327/62 |
| 6,677,822 | B2 | 1/2004 | Hasegawa | 330/258 |
| 6,791,950 | B2 | 9/2004 | Wu | 370/257 |
| 6,977,523 | B2 * | 12/2005 | Tamaki | 326/68 |
| 2003/0132778 | A1 | 7/2003 | Gion | |
| 2005/0134366 | A1 * | 6/2005 | Ozasa et al. | 327/543 |

FOREIGN PATENT DOCUMENTS

| | | |
|---|---|---|
| CA | 2356242 | 6/2008 |
| KR | 1020020076736 | 10/2002 |
| KR | 10-2003-0026038 | 3/2003 |
| KR | 100662985 | 12/2006 |
| TW | 395130 | 6/1989 |
| TW | 1236815 | 7/2005 |

* cited by examiner

*Primary Examiner*—Tuan T Lam
*Assistant Examiner*—Hiep Nguyen
(74) *Attorney, Agent, or Firm*—F. Chau & Associates, LLC

(57) ABSTRACT

A high speed analog transmission envelope (data-validity) detector for detecting the validity or invalidity of received data by generating (and comparing) first through fourth level-shifted signals based on a pair of differential input signals that are externally applied (received). Each of the first through fourth level-shifted signals has voltage levels different from (e.g., higher than) the differential input signals. After comparing the first through fourth level-shifted signals with each other, the comparison results are used in determining the validity of the differential input signals (data). The analog transmission envelope (data) detector flexibly adapts to variations in common mode voltage, and simplifies the circuit architecture because it does not require an additional reference voltage for determining the validity of received data.

23 Claims, 5 Drawing Sheets

HIGH SPEED ANALOG ENVELOPE DETECTOR

CROSS-REFERENCE TO RELATED APPLICATIONS

This U.S. non-provisional patent application claims priority under 35 U.S.C. § 119 of Korean Patent Application 2004-108790 filed on Dec. 20, 2004, the entire contents of which are hereby incorporated by reference.

BACKGROUND OF THE INVENTION

1. Field of the Invention

The present invention relates to analog front ends for high speed serial communication and more particularly to analog transmission envelope detectors operable at the high frequencies of USB2.0.

2. Description of the Related Art

With increases in operating frequencies of central processing units (CPUs) of personal computers (PCs) on the order of several GHz, there have been proposed various high-frequency interfacing systems. For example, there are peripheral component interconnection (PCI) bus systems and IEEE 1284, as kinds of parallel interfacing schemes. Parallel interfacing schemes offer sufficient bandwidth, but there is a disadvantage of too large a data width which increases the number of wires required and the weight and size of cables. Further, parallel interfacing schemes require additional signal lines for control signals. And, if the number of signal lines increases in small apparatuses such as mobile phones, electro-magnetic interference (EMI) increases as well as degradation of power efficiency. And, the increased number of signal lines occupies more space for the signal lines, making it difficult to miniaturize the small apparatuses. Therefore, consumer product manufacturers are actively studying to change data transmission methods from parallel schemes to serial schemes.

Mobile display digital interface (MDDI) is an interface scheme assisting serial communication between mobilephone modems and liquid crystal display (LCD) units. The MDDI is capable of reducing the number of signal lines to about one-tenth (1/10) of the parallel interface scheme and transceiving data with low power, which provides high power efficiency in use.

High speed serial interface schemes include IEEE1394 and universal serial bus (USB). The IEEE1394 originally provided a wide bandwidth of 400 Mbps and is widely used in audio-visual (AV) products such as camcorders, digital cameras and in modems. And, more recently with the advent of USB2.0, the IEEE1394 increased its bandwidth up to 480 Mbps at maximum, which enables real-time transmission of multimedia data. Constructing a system with USB scheme is simpler than with IEEE1394. Since the USB is able to select bandwidths in accordance with operating speeds of peripheral devices, it is highly advantageous in cost and efficiency.

FIG. 1 is a block diagram of a conventional analog front end including a conventional transmission envelope detector for USB2.0. The configuration of the analog front end for the USB2.0 is specified in "Universal Serial Bus Specification Revision 2.9", published by USB-Implementers Forum Inc. on Apr. 17, 2000. The analog front end is a low level analog circuit conducting physical connections through D+/D− (DP/DM) signal lines. The USB2.0 is further comprised of circuits to perform high-frequency communication, such as a transmission envelope detector 10, a high-speed (HS) differential data receiver 20, and a HS current driver 30.

High-speed (or high-frequency) data transmission is carried out by flowing current through one of two transmission lines. For instance, the D+ line flows a current to transmit a data bit of a logical "high" (e.g., one) and the D− line flows a current to transmit a data bit of logical "low" (e.g., zero). For that purpose, the HS current driver 30 switches a current of 17.78 mA toward the D+ or D− line.

The HS differential data receiver 20 is used for receiving data at a high speed. The quiescent state of a high speed (HS) link is for the D+ and D− lines to be balanced near ground with the differential receivers listening for a "Start of Packet". The Transmission Envelope Detector is invoked to prevent spurious signals (e.g., noise, crosstalk, or oscillation) from triggering the "Start of Packet" detection process (to "squelch" the receiver).

The transmission envelope detector is used to disable or "squelch" the high speed (HS) receiver when the amplitude of the differential signal falls below the minimum required level for data reception, preventing noise from propagating through the receive logic. The conventional transmission envelope detector 10 compares data that is received through the HS differential data receiver with a reference voltage of a predetermined magnitude and then determines whether the received data is valid or noise. For example, if the received data is smaller than the reference voltage, the envelope detector 10 determines that the received data is noise and accordingly disables peripheral circuits. If the received data is larger than the reference voltage, the envelope detector 10 determines the received data is valid data and enables the peripheral circuits accordingly. The peripheral circuits maintain the power in a low level state (or a power-off state) or change the power condition to an operation mode, in response to the result of the validity determination.

The reference voltage used in the comparison made by the envelope detector 10 is predesignated as 0.125V by the USB2.0 specification. In general, the reference voltage is supplied from an external source. However, when using the external reference voltage, it is difficult to deal with common-mode (CM) voltage variation because the reference voltage level is independent and fixed. And it is complicated to construct the circuit due to additional structures of a first differential amplifier to amplify a difference between a reference voltage and an input signal received from the D+ line, and a second differential amplifier to amplify a difference between the reference voltage and an input signal received from the D− line. Without accepting the reference voltage from the external source, it is necessary to determine the CM value by using an additional circuit (e.g., a CM detection circuit). Thus, settling a CM voltage takes a long time, and constructing the circuit is complicated as well.

The validity determination for a received signal in the transmission envelope detector 10 is used for quickly deciding the operational mode of other circuits. In the high speed interface environment, such as MDDI and USB2.0, the envelope detector 10 is required to determine the validity of the received signal within the range of several nanoseconds or several bits. In particular, considering that the interface schemes of MDDI and USB2.0 are HS interface systems applicable to portable apparatuses such as mobile phones, the envelope detector 10 needs to be small so as to enhance spatial efficiency therein. The transmission envelope (data-validity) detector 10 needs to be capable of dealing with variations in the common mode (CM) voltage. And, the transmission envelope (data-validity) detector 10 needs to be capable of functioning even in a low voltage environment considering that power supply voltage levels of portable apparatus are being lowered.

SUMMARY OF THE INVENTION

Embodiments of the invention provide a high-speed envelope (data validity) detector capable of determining the validity of a received differential data signal without using an additional reference voltage. Embodiments of the invention also provide a high-speed transmission envelope detector capable of flexibly adapting to variations of common-mode voltage and input voltage range.

A first aspect of the invention provides a data-validity detector (e.g., a transmission envelope detector) comprising: a first level shifter configured to generate first and second level-shifted signals based on a received first differential input signal, wherein the first level-shifted signal has a voltage level different from (e.g., higher than) the first differential input signal, and the first level-shifted signal has a voltage level different from (e.g., higher than) the second differential input signal and the first level-shifted signal; and a second level shifter configured to generate third and fourth level-shifted signals based on a second received differential input signal, wherein the third level-shifted signal has a voltage level different from (e.g., higher than) the second differential input signal, and the fourth level-shifted signal has a voltage level different from (e.g., higher than) the second differential input signal and the third level-shifted signal.

The detector may further comprise a comparing circuit configured to determine validity of the first and second differential input signals by comparing the voltage levels of the first through fourth level-shifted signals. The comparing circuit may comprise a first comparator configured to compare the first level-shifted signal with the fourth level-shifted signal and a second comparator configured to compare the third level-shifted signal with the second level-shifted signal. The comparing circuit further comprises a logic unit configured to performing a logical operating (e.g., an ORing operation) upon the outputs from the first and second comparators.

In various exemplary embodiments of the invention (e.g., as shown in FIG. 2), the first level-shifted signal has a voltage level higher than the first differential input signal, and the first level-shifted signal has a voltage level higher than the second level-shifted signal; and the fourth level-shifted signal has a voltage level higher than the second differential input signal, and the third level-shifted signal has a voltage level higher than the fourth level-shifted signal. In such embodiments, the comparing circuit determines the differential input signals as being invalid when the voltage level of the first level-shifted signal is higher than the fourth level-shifted signal and the voltage level of the third level-shifted signal is higher than the second level-shifted signal. The comparing circuit determines the differential input signals as being valid when the voltage level of the first level-shifted signal is lower than the fourth level-shifted signal; and the comparing circuit determines the differential input signals as being valid when the voltage level of the third level-shifted signal is lower than the second level-shifted signal.

A high speed (HS) transmission envelope detector (e.g., for use in an analog front end of a USB2.0 transceiver) according to a preferred embodiment of the invention generates first through fourth level-shifted signals in response to differential input signals (e.g., that are received from an external device), the first through fourth level-shifted signals having voltage levels higher than the differential input signal. After comparing the first through fourth level-shifted signals with each other, the compared result is used in determining the validity of data transmitted in the differential input signals. The transmission envelope detector flexibly adapts to variations of the common mode voltage, and simplifies the circuit architecture, (e.g., because it does not need an additional reference voltage for determining the data validity).

An aspect of the invention provides an envelope detector comprising: a level shifter unit for generating first through fourth level-shifted signals (based on the first and second differential input signals) having voltage levels higher than the first and second differential input signals; and a comparing circuit determining validity of the first and second differential input signals based on the result of comparing the voltage levels of the first through fourth level-shifted signals.

In a preferred embodiment, the first and second level-shifted signals are generated in response to the first differential input signal having a positive value and the (voltage level of the) first level-shifted signal is higher than the (voltage level of the) second level-shifted signal, and the third and fourth level-shifted signals are generated in response to the second differential input signal having a negative value and the (voltage level of the) third level-shifted signal is higher than the (voltage level of the) fourth level-shifted signal.

In a preferred embodiment, the comparing circuit determines the differential input signals as being invalid when the (voltage level of the) first level-shifted signal is higher than the (voltage level of the) fourth level-shifted signal and the (voltage level of the) third level-shifted signal is higher than the (voltage level of the) second level-shifted signal.

In a preferred embodiment, the comparing circuit determines the differential input signals as being valid when the (voltage level of the) first level-shifted signal is lower than the (voltage level of the) fourth level-shifted signal. And, the comparing circuit determines the differential input signals as being valid when the (voltage level of the) third level-shifted signal is lower than the (voltage level of the) second level-shifted signal.

In a preferred embodiment, the level shifter unit comprises first and second level shifters. The first level shifter comprises a first transistor receiving the first differential input signal. The second level shifter comprises a second transistor receiving the second differential input signal.

In a preferred embodiment, each of the first and second level shifters is a source follower having two output levels based on the source voltage of its transistor.

In a preferred embodiment, the first level shifter comprises first and second resistors provided to adjust voltage levels of the first and second level-shifted signals. The second level shifter comprises third and fourth resistors provided to adjust voltage levels of the third and fourth level-shifted signals.

In a preferred embodiment, the source of the first transistor is connected to the first and second resistors in series, and the source of the second transistor is connected to the third and fourth resistors in series.

In a preferred embodiment, the level shifter comprises a reference current supply circuit providing equal (mirrored) first and second reference currents (having equal and constant levels) to the first through fourth resistors.

In a preferred embodiment, the first through fourth level-shifted signals are determined by the voltage drop through the first through fourth resistors due to the reference current.

In a preferred embodiment, the comparing circuit comprises: a first comparator comparing the (voltage level of the) first level-shifted signal with the (voltage level of the) fourth level-shifted signal; a second comparator comparing the (voltage level of the) third level-shifted signal with the (voltage level of the) second level-shifted signal; and a logic unit prosecuting a logical operation (e.g., an ORing operation) upon the results generated from the first and second comparators. The binary output of the logic unit indicates whether the received differential signal is valid or invalid.

BRIEF DESCRIPTION OF THE DRAWINGS

The accompanying drawings are included to provide a further understanding of the invention, and are incorporated in and constitute a part of this specification. Preferred embodiments of the present invention will be described below in more detail with reference to the accompanying drawings. The present invention may, however, be embodied in different forms and should not be constructed as limited to the exemplary embodiments set forth herein. In the figures, like numerals refer to like elements throughout the specification. The drawings illustrate examples of embodiments of the present invention and, together with the description, serve to explain principles of the present invention. In the drawings.

DETAILED DESCRIPTION OF PREFERRED EMBODIMENTS

Figure 1:
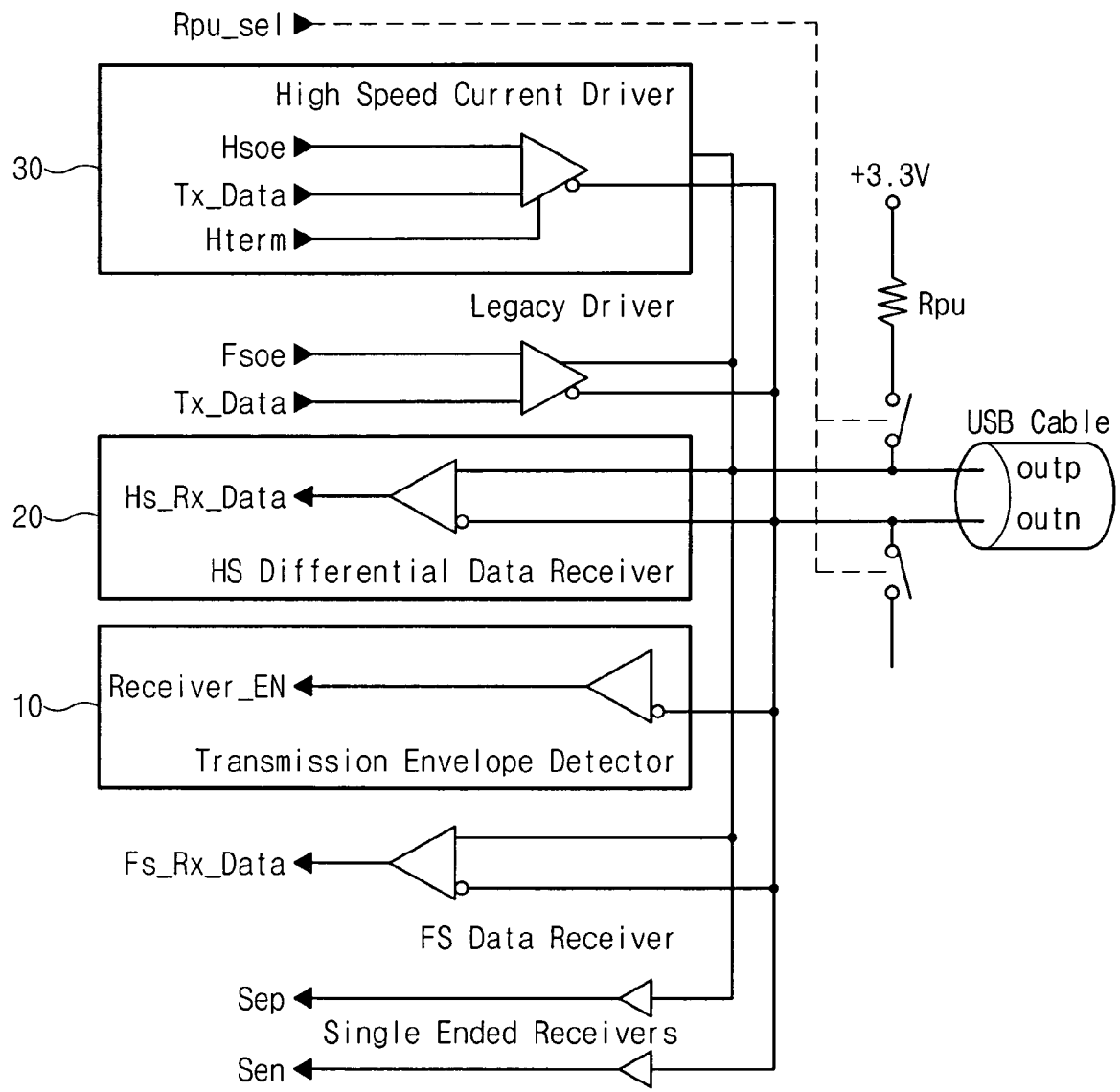
FIG. 1 is a block diagram of an analog front end for USB2.0 including a conventional transmission envelope detector.
Figure 2:
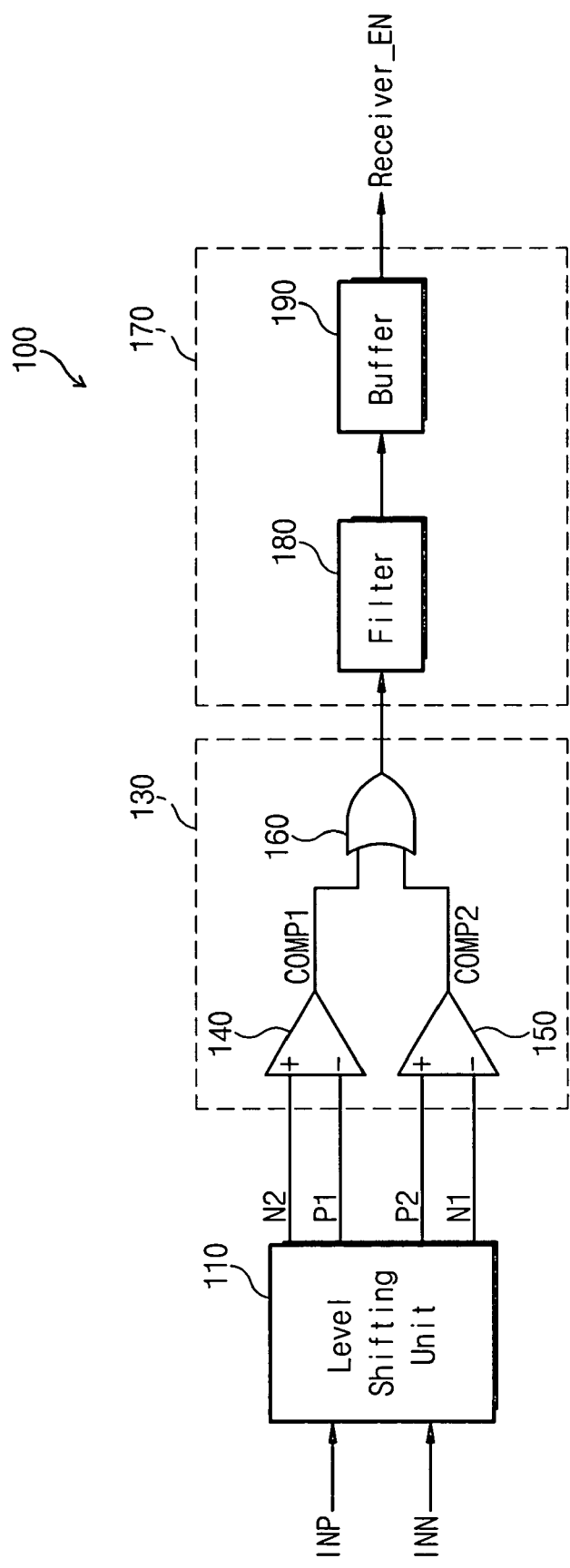
FIG. 2 is a block diagram of a transmission envelope detector for an analog front end for USB2.0 in accordance with a preferred embodiment of the invention.

FIG. 2 is a block diagram of a transmission envelope detector 100 in accordance with a preferred embodiment of the invention.

Referring to FIG. 2, the envelope detector 100 is comprised of a level shifting unit 110, a comparing circuit 130, and an output signal conditioning circuit 170. The level shifting unit 110 generates first through fourth level-shifted signals P1, P2, N1, and N2 having voltage levels higher than differential input signals INP and INN, in responds to the differential input signals INP and INN that are received (e.g., from an external device via USB cables).

The first and second level-shifted signals P1 and P2 are generated in response to the differential input signal INP having a positive value. The third and fourth level-shifted signals, N1 and N2, are generated in response to the differential input signal INN having a negative value. The first level-shifted signal P1 has a voltage level higher than that of the second level-shifted signal P2. The third level-shifted signal N1 has a voltage level higher than that of the fourth level-shifted signal N2.

The comparing circuit 130 performs a validity determination operation for the differential input signals INP and INN by comparing the first through fourth level-shifted signals P1, P2, N1, and N2. The comparing circuit 130 comprises first and second comparators 140 and 150, and an OR-gate 160.

The first comparator 140 receives the first level-shifted signal P1 through its inverted input terminal, and receives the fourth level-shifted signal N2 through its non-inverted input terminal. The first comparator 140 generates a first comparison signal COMP1 by comparing the first level-shifted signal P1 with the fourth level-shifted signal N2. For instance, if the first level-shifted signal P1 is larger than the fourth level-shifted signal N2, the first comparison signal COM1 is generated with a negative value (i.e., a logical low level). Conversely, if the first level-shifted signal P1 is smaller than the fourth level-shifted signal N2, the first comparison signal COM1 is generated with a positive value (i.e., a logical high level).

The second comparator 150 receives the third level-shifted signal N1 through its inverted input terminal, while receives the second level-shifted signal P2 through its non-inverted input terminal. The second comparator 150 generates a second comparison signal COMP2 by comparing the third level-shifted signal N1 with the second level-shifted signal P2. For instance, if the third level-shifted signal N1 is larger than the second level-shifted signal P2, the second comparison signal COM2 is generated with a negative value (i.e., a logical low level). Conversely, if the third level-shifted signal N1 is smaller than the second level-shifted signal P2, the second comparison signal COM2 is generated with a positive value (i.e., a logical high level).

The first and second comparison signals COMP1 and COMP2 generated from the first and second comparators 140 and 150 are applied to the OR-gate 160. The OR-gate 160 immediately performs a logical operation (i.e., a logical ORing operation) upon the first and second comparison signals COMP1 and COMP2, and then outputs the result (which indicates the validity or invalidity of the received data) to the output signal conditioning circuit 170.

The OR-gate 160 generates a logical low-level signal as a result of the ORing operation when the first and second comparison signals COMP1 and COMP1 are all negative values. If either the first comparison signal COMP1 or the second comparison signals COMP2 is a positive value (i.e., logical high level), a logical high level signal is generated as a result of the logical ORing operation. If the result of the logical ORing operation, which is a logical low level, that means that the received signal is a signal (i.e., a noise) insufficient compared to a predetermined signal standard in the specification such as the USB2.0. Conversely, if a logical ORing operation results in a logical high level, that means that the received signal is a valid (data) signal satisfying the specification such as the USB2.0.

The comparing circuit 130 determines the differential input signal is invalid (a noise) when the first level-shifted signal P1 has a higher voltage level than the fourth level-shifted signal N2 and the third level-shifted signal N1 has a higher voltage level than the second level-shifted signal P2. The comparing circuit 130 determines the differential input signal is valid when either first level-shifted signal P1 has a lower voltage level than the fourth level-shifted signal N2 or/and the third level-shifted signal N1 has a lower voltage level than the second level-shifted signal P2.

The output signal conditioning circuit 170 removes noises from the validity-determination signal output by the comparing circuit 130. The output signal conditioning circuit 170 provides the noiseless HS receiver-enabling signal Receiver_EN as an output signal of the envelope detector 100. The output signal conditioning circuit 170 is comprised of a filter 180 and a buffer 190. The filter 180 is composed of a low-pass filter (LPF) including a capacitor or a capacitor-resistor. The buffer 190 stores the noiseless signal output by the filter 180 and then outputs it as the output signal Receiver_EN of the envelope detector 100.

Circuits at the receiver, connected to the envelope detector 100, are enabled or disabled in response to the state (voltage level) of the output signal Receiver_EN. For instance, if the received signal is determined as being valid (i.e., there is a differential input activating a Receiver_EN from the envelope detector 100 having a high level), a power state goes to an operational mode. Otherwise, if determines that the received signal is invalid (i.e., there is a differential input activating a Receiver_EN from the envelope detector 100 having a low level), the power state enters into a lower speed mode, a lower power mode (or a power-off mode).

As above described, the envelope detector 100 according to embodiments of the invention only receives the differential input signals INP and INN (from the external device) and internally generates the first through fourth level-shifted signals in response to the differential input signals. And, the envelope detector 100 determines the validity of the received signal by comparing the first through fourth level-shifted signals. Thus, there is no need for a reference voltage in determining the validity for the received signal, so embodiments of the invention simplify the detector's circuit structure and enables a designer or user to flexibly adjust for a range of input voltages. As a result, it is possible to provide the flexibility needed to deal with variations in common-mode voltage.

Figure 3:
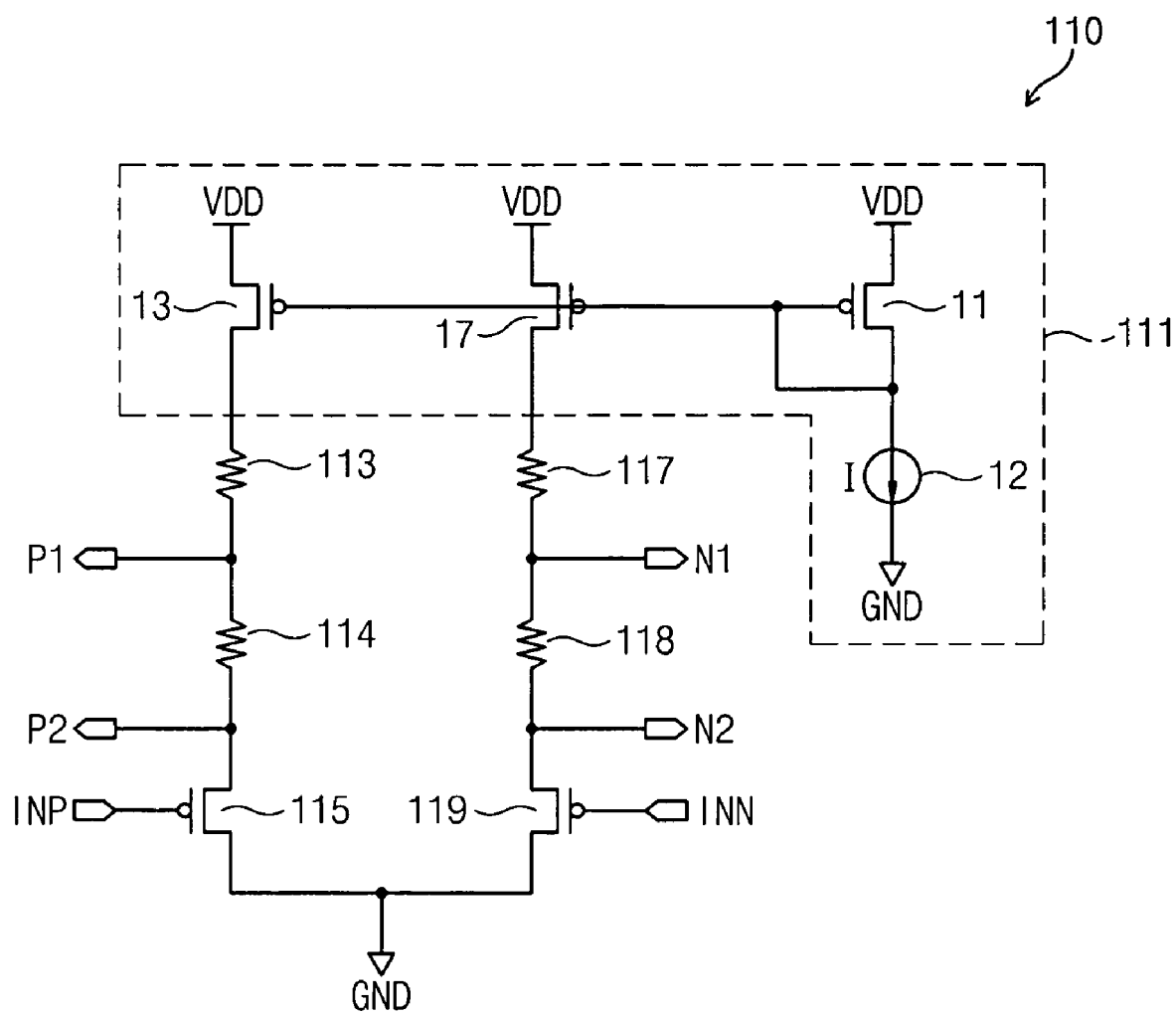
FIG. 3 is a circuit diagram of the level shifting unit of the transmission envelope detector of FIG. 2.

FIG. 3 is a circuit diagram of the level shifting unit 110 in the detector 100 of FIG. 2. Referring to FIG. 3, the level shifting unit 110 according to an embodiment of the invention is comprised of a reference current supply circuit 111, first through fourth load resistors 113, 114, 117, and 118, and first and second PMOS transistors 115 and 119.

The first and second PMOS transistors 115 and 119 are coupled to the differential input signals INP and INN at their gate terminals, respectively. The source terminal of the first PMOS transistor 115 is connected in series to the first and second transistors 113 and 114. The source terminal of the second PMOS transistor 117 is connected in series to the third and fourth resistors 117 and 118. And, the drain terminals of the first and second PMOS transistors 115 and 119 are commonly connected to a ground voltage GND.

The reference current supply circuit 111 is comprised of a current source 12, and first through third PMOS transistors 11, 13, and 17. The reference current supply circuit 111 provides a reference (constant) current I having a constant level.

The current source 12 outputs the reference current I having a constant level. The first PMOS transistor 11 together with the second and third PMOS transistors 13 and 17 constitutes a current mirror (or two commonly connected current mirrors). The second and third PMOS transistors 13 and 17 mirror the reference current I respectively through the first and second resistors 113 and 114, and through the third and fourth resistors 117 and 118.

The reference (constant) current I is mirrored as a first reference current through the first and second resistors 113 and 114. The reference (constant) current I is mirrored as a second reference current through the third and fourth resistors 117 and 118. The first and second resistors 113 and 114 are connected serially to the source terminal of the first PMOS transistor 115. The third and fourth resistors 117 and 118 are connected serially to the source terminal of the second PMOS transistor 119.

The level shifting unit 110 shown in FIG. 3 is constructed in the form of a source follower with an output level determined by source voltages of the first and second PMOS transistors 115 and 119. In the level shifting unit 110 having the structure of the source follower, the level-shifted signals P2, and N2 are output voltages at the source terminals of the first and second PMOS transistors 115 and 119, and level-shifted signals P1 and N1 are output at the same time. Thus, the level shifting unit 110 operates at high speed and faster than a common-mode differential amplifier that generates an output signal by amplifying an input signal by a predetermined gain. The envelope detector is well adapted to high speed interface systems such as the MDDI and the USB2.0.

The first through fourth level-shifted signals P1, P2, N1, and N2 are defined by voltages across each of the first through fourth resistors 113, 114, 117, and 118. The voltage across each of the resistors 113, 114, 117, and 118 is proportional to the magnitude of the reference current I. Therefore, voltage levels of the first through fourth level-shifted signals P1, P2, N1, and N2 are variable in proportion with the magnitude of the reference current I.

When the voltage level of the first level-shifted signal P1 is higher than the voltage level of the fourth level-shifted signal N2 and the voltage level of the third level-shifted signal N1 is higher than that of the second level-shifted signal P2, then the differential input signal received is considered as being invalid (i.e., noise). When the voltage level of the first level-shifted signal P1 is lower than that of the fourth level-shifted signal N2 or/and the voltage level of the third level-shifted signal N1 is lower than that of the second level-shifted signal P2, then the differential input signal received is considered as being valid data. Thus, the resistance each of the first through fourth resistors 113, 114, 117, and 118 may be selected to optimize the margins between the voltage level of the first level-shifted signal P1 and that of the fourth level-shifted signal N2, and between the voltage level of the third level-shifted signal N1 and that of the second level-shifted signal P2, in the event of valid data (e.g., a when a 0V signal is received at one of the differential input terminals and a 0.15V signal is received at the other one).

Preferably, the first through fourth resistors 113, 114, 117, and 118 are designed to be equal to each other, and current-mirroring transistors 11, 13 and 17 are the same size (e.g., same channel width). And, in such preferred embodiments of the invention, the voltage across each of the resistors 113, 114, 117, and 118 is equal to the product of the reference current I and the sum of the first through fourth resistors 113, 114, 117, and 118.

Figure 4A:
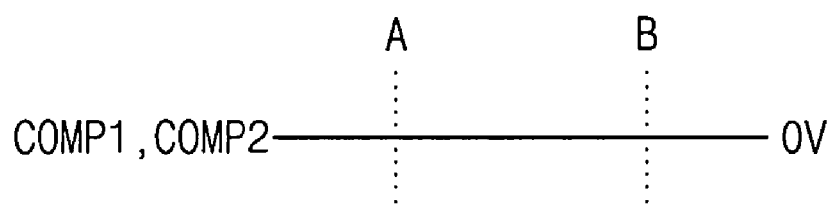
FIGS. 4A and 4B are signal diagrams illustrating input and output waveforms of the level shifting unit shown in FIGS. 2 and 3 when there is no valid (data) signal.
Figure 4B:
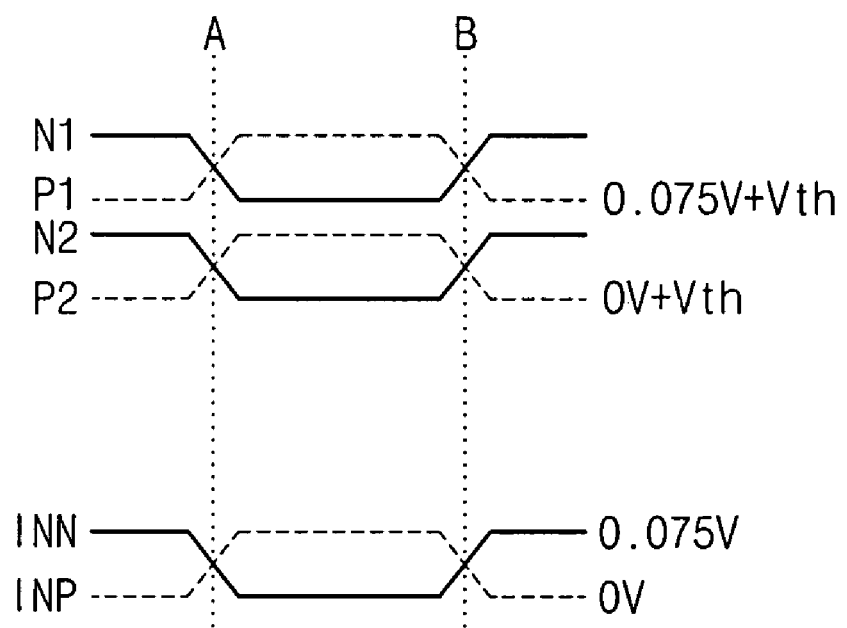
Figure 5A:
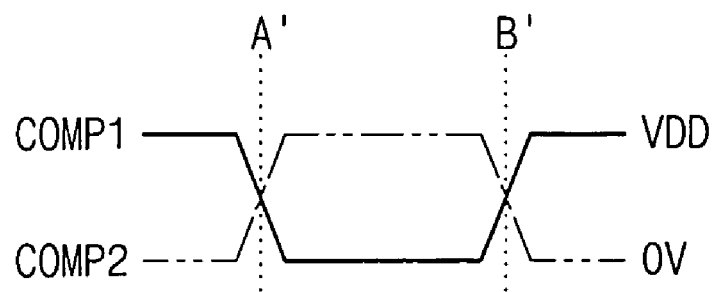
FIGS. 5A and 5B are signal diagrams illustrating input and output waveforms of the level shifting unit shown in FIGS. 2 and 3 when there is a valid (data) signal.
Figure 5B:
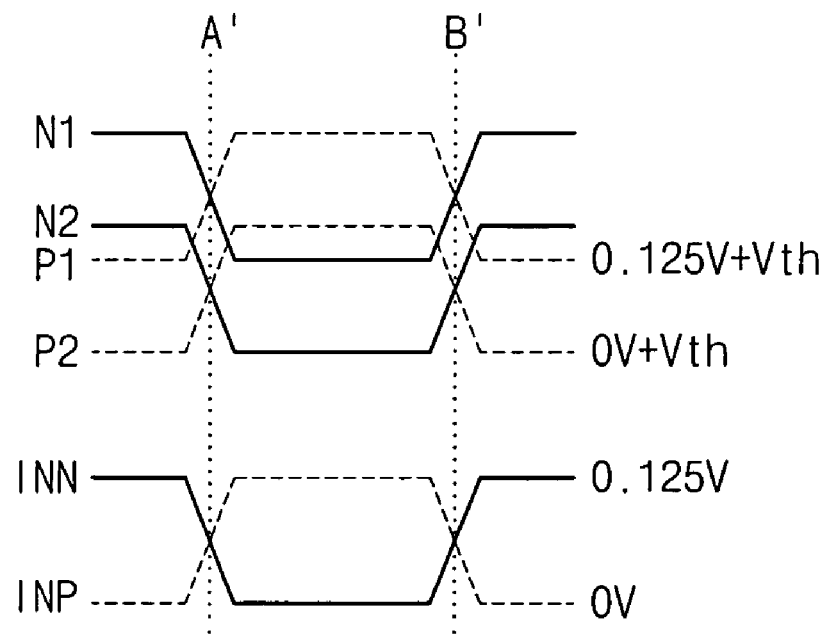

FIGS. 4A and 4B are diagrams illustrating input and output waveforms of the level shifting unit shown in FIGS. 2 and 3 when there is no valid signal. Similarly, FIGS. 5A and 5B are diagrams illustrating input and output waveforms of the level shifting unit shown in FIGS. 2 and 3 when there is a valid signal. In FIGS. 4A through 5A, the input and output waveforms of the level shifting unit 110 are measured in the case where the first through fourth resistors 113, 114, 117, and 118 have the same resistance, and the current-mirroring transistors 11, 13 and 17 are the same size (e.g., same channel width).

In data communication systems, signals may be received at receivers even without signals being sent from transmitters. For instance, as shown in FIG. 4B, a signal in the range from 0V to 0.1V, i.e., a noise, can be detected at a receiver of the USB2.0 even though a transmitter does not send a signal. And, when the transmitter sends a valid signal, the receiver receives a signal at a predetermined level. For example, as illustrated in FIG. 5B, when the transmitter sends a valid signal, a signal with the size from 0V to 0.15V is detected at the differential input terminals of the receiver of the USB2.0 system.

The transmission envelope detector 100 generates the first through fourth level-shifted signals P1, P2, N1, and N2 with voltage levels higher than the differential input signals INP and INN in response to the differential input signals INP and INN. And then, each of the first through fourth level-shifted signals is compared with the other in its corresponding voltage level domain. With reference to the comparison results COMP1 and COMP2, the transmission envelope detector 100 determines whether the differential input signals INP and INN are noises or valid signals.

The following describes the signals used in the transmission envelope detector 100 for determining the validity of the received signal.

As illustrated in FIGS. 4B and 5B, the first and second level-shifted signals P1 and P2 are configured to have the same phase as the differential input signal INP that has a positive voltage. Both the first and second level-shifted signals P1 and P2 have voltage levels higher than that of the differential input signal INP. The voltage level of the first level-shifted signal P1 is higher than that of the second level-shifted signal P2. The third and fourth level-shifted signals N1 and N2 are configure to have the same phase as the differential input signal INN with a negative value. Both the third and fourth level-shifted signals N1 and N2 have voltage levels higher than that of the differential input signal INN. The third level-shifted signal N1 has a voltage level higher than that of the fourth level-shifted signal N2.

The first through fourth level-shifted signals P1, P2, N1, and N2 are compared with each other by the comparing circuit 130. The first and fourth level-shifted signals, P1 and N2, are compared with each other by the first comparator 140, while the second and third level-shifted signals, P2 and N1, are compared with each other by the second comparator 150. The first comparator 140 generates the first comparison signal COMP1 with a negative value (i.e., logical low level) when the first level-shifted signal P1 is larger than the fourth level-shifted signal N2. The first comparison signal COMP1 is generated with a positive value (i.e., logical high level) when the first level-shifted signal P1 is smaller than the fourth level-shifted signal N2. The second comparator 150 generates the second comparison signal COMP2 with a negative value (i.e., logical low level) when the third level-shifted signal N1 is larger than the second level-shifted signal P2. The second comparison signal COMP2 is generated with a positive value (i.e., logical high level) when the third level-shifted signal N1 is smaller than the second level-shifted signal P2.

FIGS. 4A and 5A show the waveforms of the first and second comparison signals COMP1 and COMP2 output from the first and second comparators 140 and 150. For instance, as illustrated in FIG. 4B, the first and second comparison signals COMP1 and COMP2 are generated all with logical low levels if the (voltage level of the) first level-shifted signal P1 is higher than the (voltage level of the) fourth level-shifted signal N2 in voltage level and if the (voltage level of the) third level-shifted signal N1 is higher than the second level-shifted signal P2. In this case, the differential input signal received is determined as being invalid (i.e., a noise).

And, as illustrated in FIG. 5B, one of the first and second comparison signals COMP1 and COMP2 is generated with a logical high level if the (voltage level of the) first level-shifted signal P1 is lower than the (voltage level of the) fourth level-shifted signal N2 in voltage level or/and if the (voltage level of the) third level-shifted signal N1 is lower than the (voltage level of the) second level-shifted signal P2. In this case, the differential input signal received is determined as being valid (data).

In FIGS. 4A through 5B, the portions denoted by A-B and A'-B' are time points where phases of the signals are intersecting each other, at which points noises may occur. The noises generated at the intersecting points are removed by the filter 180. As the noises generated at the intersecting points have high frequencies, a low-pass filter removes the noises.

As aforementioned, the envelope detector 100 according to the invention determines the validity of the differential input signals INP and INN with reference to a result of comparing voltage levels of the first through fourth level-shifted signals P1, P2, N1, and N2 that are generated in response to the differential input signals INP and INN, without using an additional reference voltage. As a result, it is possible to simplify the circuit structure thereof and to control the range of input voltage properly, flexibly adapting to variations of common-mode voltage.

As described above, the analog envelope detector according to the invention is able to determine the validity of a received signal in high speed without using an additional reference voltage. Moreover, the invention enables the analog envelope detector to flexibly adapt to variations of input voltage range and common-mode voltage with a simpler hardware architecture.

Although the present invention has been described in connection with the exemplary embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A data detector comprising:
   a first level shifter configured to generate first and second level-shifted signals based on a first differential input signal applied from an external device, wherein the first level-shifted signal has a voltage level higher than the first differential input signal, and the first level-shifted signal has a voltage level higher than the second level-shifted signal; and
   a second level shifter configured to generate third and fourth level-shifted signals based on a second differential input signal applied from an external device, wherein the fourth level-shifted signal has a voltage level higher than the second differential input signal, and the third level-shifted signal has a voltage level higher than the fourth level-shifted signal;
   a reference current supply circuit configured to supply a first reference current through the first level shifter and a second reference current through the second level shifter; and
   a comparing circuit configured to compare the first level-shifted signal with the fourth level-shifted signal; and to compare the third level-shifted signal with the second level-shifted signal.

2. The detector as set forth in claim 1, wherein the comparing circuit determines the differential input signals as being invalid when the voltage level of the first level-shifted signal is higher than the fourth level-shifted signal and the voltage level of the third level-shifted signal is higher than the second level-shifted signal.

3. The detector as set forth in claim 1, wherein the comparing circuit determines the differential input signals as being valid if the voltage level of the first level-shifted signal is lower than the fourth level-shifted signal.

4. The detector as set forth in claim 3, wherein the comparing circuit determines the differential input signals as being valid if the voltage level of the first level-shifted signal is lower than the fourth level-shifted signal and the voltage level of the third level-shifted signal is lower than the second level-shifted signal.

5. A data detector comprising:
   a first level shifter configured to generate first and second level-shifted signals based on a first differential input signal applied from an external device, wherein the first level-shifted signal has a voltage level higher than the first differential input signal, and the first level-shifted signal has a voltage level higher than the second level-shifted signal;

a second level shifter configured to generate third and fourth level-shifted signals based on a second differential input signal applied from an external device, wherein the fourth level-shifted signal has a voltage level higher than the second differential input signal, and the third level-shifted signal has a voltage level higher than the fourth level-shifted signal;

a reference current supply circuit configured to supply a first reference current through the first level shifter and a second reference current through the second level shifter; and a comparing circuit configured to determine validity of the first and second differential input signals based on comparing the voltage levels of the first through fourth level-shifted signals.

6. The detector as set forth in claim 5, wherein the comparing circuit comprises:

a first comparator configured to compare the first level-shifted signal with the fourth level-shifted signal;

a second comparator configured to compare the third level-shifted signal with the second level-shifted signal.

7. The detector as set forth in claim 6, wherein the comparing circuit further comprises a logic unit configured to performing a logical operation upon outputs from the first and second comparators.

8. The detector as set forth in claim 7, wherein the logicaloperation performed by the logic unit upon outputs from the first and second comparators is a logical ORing operation.

9. The detector as set forth in claim 1, wherein the first level shifter comprises a first transistor configured to receive the first differential input signal at its gate, and the second level shifter comprises a second transistor configured to receive the second differential input signal at its gate.

10. The detector as set forth in claim 9, wherein the second level-shifted signal is the source voltage of the first transistor.

11. The detector as set forth in claim 9, wherein the first level shifter further comprises first and second resistors configured to control the voltage level difference between the first and second level-shifted signals.

12. The detector as set forth in claim 11, wherein the source of the first transistor is connected to the first and second resistors in series.

13. The detector as set forth in claim 11, wherein the reference current supply circuit is configured to provide the first reference current through the first and second resistors.

14. The detector as set forth in claim 9, wherein the voltage level of first level-shifted signal is based upon the voltage across the second resistor due to the first reference current.

15. The detector as set forth in claim 12, wherein the second level shifter further comprises third and fourth resistors configured to control the voltage level difference between the third and fourth level-shifted signals, and wherein the source of the second transistor is connected to the third and fourth resistors in series.

16. The detector as set forth in claim 15, wherein the reference current supply circuit is configured to provide the first reference current through the first and second resistors, and to provide the second reference current through the third and fourth resistors.

17. The detector as set forth in claim 16, wherein the first reference current and the second reference current are equal.

18. The detector as set forth in claim 15, wherein the first reference current and the second reference current are each generated by mirroring a constant current I.

19. The envelope detector as set forth in claim 5, wherein the first and second level-shifted signals are generated in response to the first differential input signal; and wherein the third and fourth level-shifted signals are generated in response to the second differential input signal.

20. A data-validity detector comprising:

a first level shifter configured to generate first and second level-shifted signals based on a received first differential input signal, wherein the first level-shifted signal has a voltage level different from the first differential input signal, and the second level-shifted signal has a voltage level different from the first differential input signal and from the first level-shifted signal;

a second level shifter configured to generate third and fourth level-shifted signals based on a second received differential input signal, wherein the third level-shifted signal has a voltage level different from the second differential input signal, and the fourth level-shifted signal has a voltage level different from the second differential input signal and from the third level-shifted signal; and a reference current supply circuit configured to supply a first reference current through the first level shifter and a second reference current equal to the first reference current through the second level shifter;

wherein the first reference current and the second reference current are each generated by mirroring a constant current I.

21. A data-validity detector comprising:

a first level shifter configured to generate first and second level-shifted signals based on a received first differential input signal, wherein the first level-shifted signal has a voltage level different from the first differential input signal, and the second level-shifted signal has a voltage level different from the first differential input signal and from the first level-shifted signal;

a second level shifter configured to generate third and fourth level-shifted signals based on a second received differential input signal, wherein the third level-shifted signal has a voltage level different from the second differential input signal, and the fourth level-shifted signal has a voltage level different from the second differential input signal and from the third level-shifted signal; and a comparing circuit configured to determine validity of the first and second differential input signals based on comparing the voltage levels of the first through fourth level-shifted signals.

22. The detector as set forth in claim 21, wherein the comparing circuit comprises:

a first comparator configured to compare the first level-shifted signal with the fourth level-shifted signal;

a second comparator configured to compare the third level-shifted signal with the second level-shifted signal.

23. The data-validity detector of claim 22, wherein the first level-shifted signal has a voltage level higher than the first differential input signal, and the first level-shifted signal has a voltage level higher than the second level-shifted signal; and wherein the fourth level-shifted signal has a voltage level higher than the second differential input signal, and the third level-shifted signal has a voltage level higher than the fourth level-shifted signal.

* * * * *